United States Patent [19]
Achor et al.

[11] Patent Number: 5,621,312
[45] Date of Patent: Apr. 15, 1997

[54] METHOD AND APPARATUS FOR CHECKING THE INTEGRITY OF A DEVICE TESTER-HANDLER SETUP

[75] Inventors: Alan Achor, Cupertino; Eric F. H. Chun, San Jose, both of Calif.; Ernest Allen, Hillsboro, Oreg.

[73] Assignee: Altera Corporation, San Jose, Calif.

[21] Appl. No.: 498,190

[22] Filed: Jul. 5, 1995

[51] Int. Cl.⁶ .................................................. G01R 31/02
[52] U.S. Cl. ............................................... 324/158.1
[58] Field of Search .......................... 324/404, 158.1; 437/8; 29/593

[56] References Cited

U.S. PATENT DOCUMENTS 3,039,604  6/1962  Bickel et al. ..................... 324/158.1
3,599,092  8/1971  Silverman ............................ 324/404
5,448,164  9/1995  Selley et al. ....................... 324/158.1

*Primary Examiner*—Ernest F. Karlsen
*Assistant Examiner*—Russell M. Kobert
*Attorney, Agent, or Firm*—Townsend and Townsend and Crew LLP

[57] ABSTRACT

A method and apparatus for checking the integrity of a device tester used in the manufacture of semiconductor devices. A device tester is used to exercise different aspects of a semiconductor device. The tester is programmed with appropriate control software that fully tests the electrical and functional characteristics of the semiconductor device.

24 Claims, 5 Drawing Sheets

METHOD AND APPARATUS FOR CHECKING THE INTEGRITY OF A DEVICE TESTER-HANDLER SETUP

BACKGROUND OF THE INVENTION

The present invention is directed to a method and apparatus for use in the manufacture of a semiconductor device. More particularly, the present invention provides a method and apparatus for checking the integrity of a semiconductor device tester configuration used to test semiconductor devices during the manufacturing process.

The manufacture of a semiconductor begins with a substrate on a silicon wafer that is doped to create the basis for an electrical circuit. The wafer is processed according to known methods and ultimately placed into a package or carrier. After the semiconductor device has been packaged, the device must be tested prior to its end use to ensure that the electrical and functional characteristics of the device are within specified limits. To perform this step of the process, a device tester is used to exercise different aspects of the semiconductor device. The tester is programmed with appropriate control software that fully tests the electrical and functional characteristics of the semiconductor device. The device under test (DUT) is loaded by a device handler into a test socket, where the tests are conducted on the DUT. The device handler holds all devices to be tested and loads each one individually into the test socket, where it is exercised by the tester.

In order to ensure the reliability of the tester's results, the integrity of the test configuration must itself be verified at different stages during the testing process. If the test configuration is flawed in any way, unreliable output could result, which could mistakenly allow a bad device to pass the test and be integrated in end-use circuit designs, though it should not be, or allow a good device to mistakenly fail the test, which would result in the device not being used in end-use circuit designs, though it should be. In either case, the overall production cost of the device increases, while the device reliability decreases.

The test configuration is currently verified by the use of a device known as a "golden unit." A golden unit is of the same device type that is being tested, which might be, merely by way of example, a microprocessor, a memory chip or a programmable logic device. The golden unit is thoroughly tested so that its characteristics are precisely known. Therefore, in verifying the parameters of the device tester, the contribution of the golden unit is a known quantity. By eliminating all variables in the test configuration aside from the device tester itself, it is possible to verify whether the tester is performing as specified.

The drawback to using a golden unit to verify the test configuration is the time, money and effort needed to thoroughly test the device and record its characteristics. If a golden unit fails or becomes damaged by the handler while being loaded into the test socket, the characterization process, and the associated expenditure of time, money and effort, must be repeated for a new golden unit. Because the golden units represent such a large investment, manufacturers are actually often reluctant to risk placing them in handlers. This requires placement of the golden unit in the test socket by hand, slowing down the testing process. Therefore, a more inexpensive and convenient method and apparatus are desired for checking the integrity of a tester setup used in the manufacture of semiconductor devices.

SUMMARY OF THE INVENTION

The present invention provides a more inexpensive and convenient method and apparatus for checking the integrity of a tester setup used in the manufacture of semiconductor devices. A unique test fixture known as a "shorting block" is used in place of the golden unit described above to verify the integrity of the test configuration. The shorting block a passive device in a package that is similar or identical to the package type of the device to be tested, but is modified by connecting together, or shorting, selected pins. The shorting block is placed in the device handler and seated in the test socket that accommodates the semiconductor device to be tested. The pins that are shorted together establish an electrical connection between the signal generation circuitry of the tester and the measurement equipment of the tester. In contrast to the golden units or any standard device to be tested, there is no delay between input and output pins through the device since the pins are shorted to each other. Because the shorting blocks are of the same package type as the devices to be tested, no change in the tester setup is required, and the tester socket that accommodates a device under test can also accommodate a shorting block. The tester software generates signals that are compared to the measured values routed back to the tester through the shorting block.

In one embodiment, selected pairs of pins in the shorting block may be connected to isolate failures on a given pin or to measure the time delay between specific input and output pins that are in a critical signal path. In another embodiment, all of the pins in the shorting block may be connected together to measure the voltage levels at each signal pin. In another embodiment, a shorting block includes a temperature sensing diode, resistor or integrated circuit to measure the temperature of the handler chamber.

A further understanding of the nature and advantages of the inventions herein may be realized by reference to the remaining portions of the specification and the attached drawings.

DESCRIPTION OF THE PREFERRED EMBODIMENT

Figure 1:
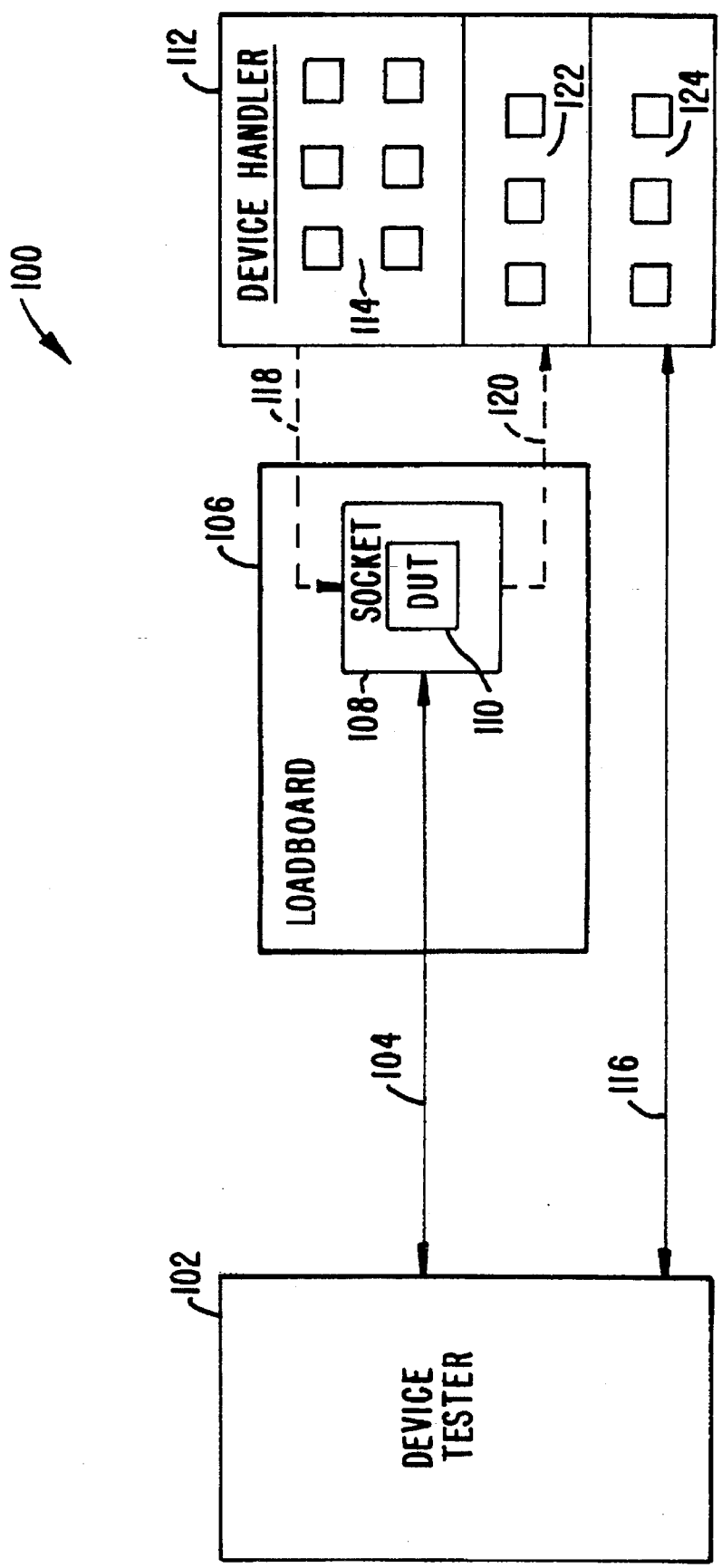
FIG. 1 is a conceptual block diagram showing the configuration of a semiconductor device tester setup.

FIG. 1 is a simplified conceptual block diagram showing the configuration of a semiconductor device tester-handler setup 100. A semiconductor device tester 102 tests a packaged device to ensure that the electrical and functional characteristics of the device are within specified limits. An example of tester 102 known to one skilled in the art is the MegaOne tester. Tester 102 includes software that can be programmed to test different types of semiconductor devices, such as, for example, microprocessors, memory chips or programmable logic devices. Test bus 104 connects the electric circuitry of tester 102 to a loadboard 106, a semicustom designed board manufactured to couple a particular device socket to tester 102. Loadboard 106 includes a test socket 108 that holds a device under test (DUT) 110. DUT 110 is the packaged unit that is tested by the hardware and software of tester 102. Loadboard 106 is also coupled to a device handler 112, which holds all of the devices 114 that need to be tested. Device handler 112 is also coupled to tester 102 by connector 116. Device handler 112 loads DUT 110 across device path 118 into socket 108, where DUT 110 may be tested by tester 102. After DUT 110 has been tested, it is unloaded from socket 108 and back into device handler 112 across device path 120. Following the testing step, the devices are sorted in handler 112 based upon the results of the test, which are communicated to handler 110 by tester 102 by connector 116. Thus, if DUT 110 passed the functional verification test, the device is classified as "good" and placed by handler 112 with other good devices 122 which can be utilized in end-use circuits. If DUT 110 fails the functional verification test, the device is classified as "bad" and set aside by handler 112 with other bad devices 124 which are not used in any circuitry.

Figure 2:
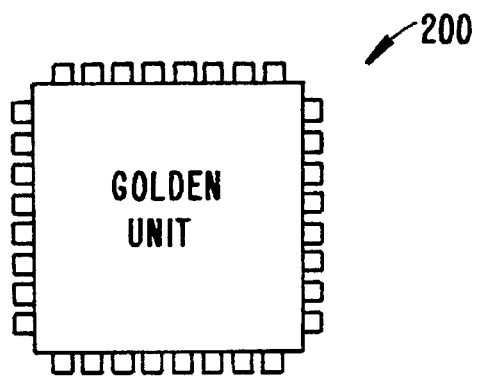
FIG. 2 shows a golden unit used to verify the integrity of a semiconductor device tester setup.

As discussed above, the tester-handler setup 100 must be verified during the testing process to ensure that tester 102 continues to deliver reliable test results. The test configuration is currently verified by the use of a golden unit 200 shown in FIG. 2 that is of the same device type as DUT 110, which might be, again merely by way of example, a microprocessor, a memory chip or a programmable logic device. Golden unit 200 is thoroughly tested and characterized prior to its use in verifying tester-handler setup 100 so that its characteristics are precisely known. Therefore, in verifying the parameters of device tester 102, the contribution of golden unit 200 is a known quantity. By eliminating all variables in the tester-handler setup 100 aside from device tester 102 itself, it is possible to verify whether device tester 102 is performing as specified.

Again, the drawback to using golden unit 200 to verify tester-handler setup 100 is the time, money and effort needed to thoroughly test golden unit 200 and record its characteristics. If golden unit 200 fails or becomes damaged by handler 112 while being loaded into test socket 108, the characterization process, and the associated expenditure of time, money and effort, must be repeated for a new golden unit.

In order to check the integrity of tester-handler setup 100, a shorting block is used in place of golden unit 200 described above. Rather than being of the exact same device type as DUT 110, as in the case of the golden unit, the shorting block is a passive device in a package that is similar or identical to the package type of the active device to be tested, but is modified by connecting together, or shorting, selected pins. The shorting block is placed in the device handler 112 and seated in test socket 108. The shorting block saves considerable time and effort by having the device handler 112 handle the shorting block along with the devices to be tested, rather than requiring placement by hand in test socket 108, as with the golden units. The shorting block acts as DUT 110, though it is not being tested itself, but is rather verifying the tester-handler setup 100. The shorting block may be used to test or verify different characteristics of tester-handler setup 100, such as, just as an example, the accuracy of timing delays for DUT 110 provided by device tester 102.

In general, to test whether the timing delays of a DUT 110 are within expected or specified ranges, tester 102 drives an input signal on an input pin of DUT 110 and strobes an associated output pin for an output signal. By recording the difference between the time that the input signal was driven and the time that the output signal was strobed, tester 102 can calculate the timing delay through a given signal path in DUT 110. Because device tester 102, and the measurement hardware, is separated from DUT 110 by the distance of test bus 104, it must factor in the time delay for the input signal to travel from tester 102 on test bus 104 to an input pin on DUT 110 as well as the time delay for the return trip on test bus 104 from an output pin on DUT 110 to tester 102. The resultant delay due to test bus 104 is subtracted from the overall delay figure to yield the time delay through DUT 110 only, which is the figure that most interests the user of device tester 102.

Device tester 102 uses a method known as time domain reflectometry (TDR) to measure the delay due to test bus 104. In a TDR test, there is no DUT 110 placed in socket 108. Tester 102 sends a signal pulse out on the cables of test bus 104 and measures a reflected return signal pulse back at tester 102. The total time delay for the TDR signal pulse from tester 102 on test bus 104 to empty socket 108 and back to tester 102 is the time delay caused by the cabling of test bus 104. This time delay is factored in to the delay figures for DUT 110 by tester 102. However, in order to provide the highest possible reliability of device tester-handler setup 100, the time delay from TDR should be separately verified. Currently, golden unit 200 is used for this purpose. However, the problems and drawbacks associated with golden unit 200 were described above. Therefore, the shorting block is a more convenient and inexpensive apparatus for verifying the TDR time delay results.

Figure 3A:
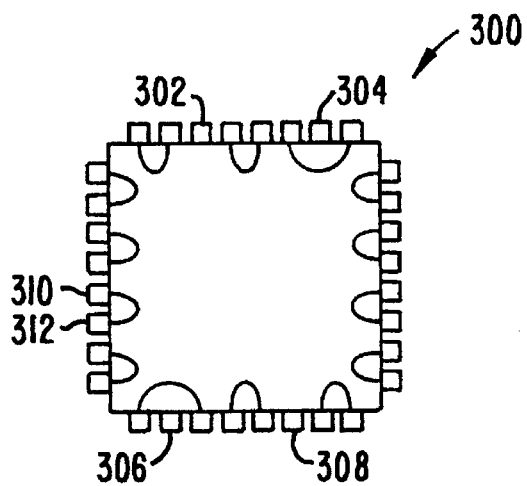
FIGS. 3A–3C show various embodiments of a shorting block used to verify the accuracy of the timing results provided by a semiconductor device tester.
Figure 3B:
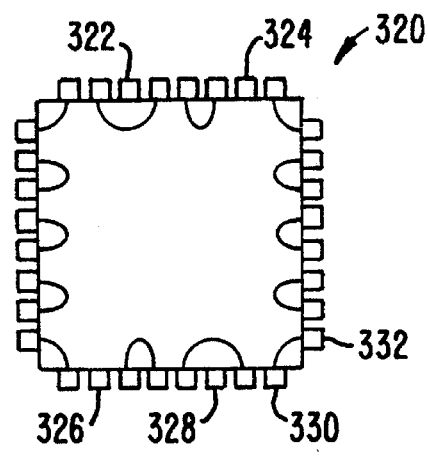
Figure 3C:
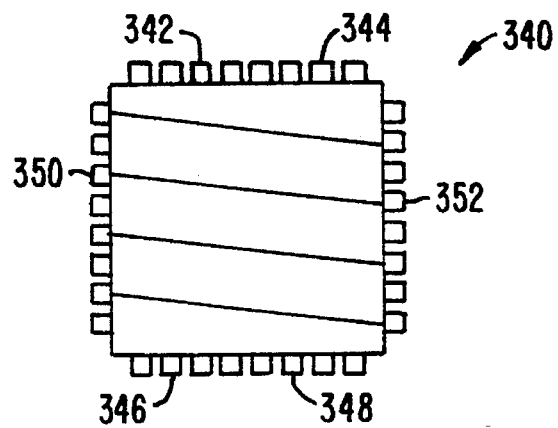

FIGS. 3A–3C show various embodiments of a shorting block used to verify the accuracy of the timing results provided by semiconductor device tester 102. FIG. 3A shows a shorting block 300 with adjacent pairs of pins shorted together. Shorting block 300 includes power pins 302 and 304 and ground pins 306 and 308. The remaining pins of shorting block 300 are signal pins. Although shorting block 300 is a passive device, as noted above, the positions of the power and ground pins must be known so that they are not coupled to signal pins when conducting timing verification tests. To verify the TDR timing delay results of tester 102, adjacent pins on shorting block 300, for example, pins 310 and 312, may be connected together to provide a complete shorted signal path through shorting block 300. Again, power pins 302 and 304 and ground pins 306 and 308 are not coupled to any of the signal pins. In operation, shorting block 300 is loaded by handler 112 into test socket 108 (FIG. 1). Device tester 102 is programmed to then drive an input signal on test bus 104 to pin 310, for example, and strobe for an output signal at pin 312, just as though an operating semiconductor device were in socket 108 and the signal path between pins 310 and 312 was being tested. Device tester 102, having already performed a TDR test, will factor in the delay from test bus 104 to calculate the time delay through shorting block 300. If the TDR test provided a correct time delay factor for test bus 104, the resulting delay for the drive and compare operation through shorting block 300 should be zero, since pins 310 and 312 are shorted together. If device tester 102 calculates a result that deviates significantly from zero for the time delay on the signal path between pins 310 and 312, the user will be made aware that device tester 102 needs to be recalibrated. The accepted range of deviation from zero depends on the type of tester being used in the system. Device tester 102 may then be recalibrated in accordance with the results of the shorting block verification test.

FIG. 3B shows shorting block 320 also having adjacent pairs of pins shorted together. Shorting block 320 includes power pins 322 and 324 and ground pins 326 and 328. The remaining pins of shorting block 320 are signal pins. Although shorting block 320 is a passive device, as noted above, the positions of the power and ground pins must be known so that they are not coupled to signal pins when conducting timing verification tests. The remaining pins of shorting block 320 are signal pins. To verify the TDR timing delay results of tester 102, adjacent pins on shorting block 320, for example, pins 330 and 332, may be connected together to provide a complete shorted signal path through shorting block 320. The operation of shorting block 320 is similar to that described above in conjunction with shorting block 300. However, by changing the pairs of pins of the shorting block that are connected together, a specific pin can be singled out during the verification process to isolate failures of a specific pin on test socket 108 or a connector on test bus 104.

FIG. 3C shows shorting block 340 having selected pairs of pins shorted together. Shorting block 340 includes power pins 342 and 344 and ground pins 346 and 348. The remaining pins of shorting block 340 are signal pins. Although shorting block 340 is a passive device, as noted above, the positions of the power and ground pins must be known so that they are not coupled to signal pins when conducting timing verification tests. The remaining pins of shorting block 340 are signal pins. To verify the TDR timing delay results of tester 102, selected pins on shorting block 340, for example, pins 350 and 352, may be connected together to provide a complete shorted signal path through shorting block 340. The operation of shorting block 340 is similar to that described above in conjunction with shorting block 300. However, by selecting specific pairs of pins to be coupled together, rather than just connecting adjacent pairs of pins, the timing delay for a previously identified critical path between selected pins 350 and 352 may be measured. These results are fed back into the control program of device tester 102, which factors them into the testing of a semiconductor device.

Figure 4:
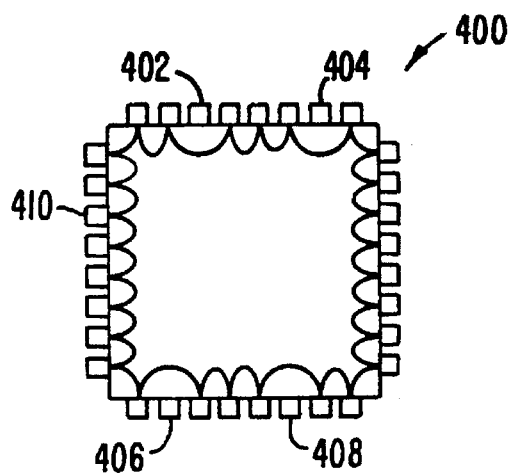
FIG. 4 shows an embodiment of a shorting block used to verify voltage level measurements provided by a semiconductor device tester.

A shorting block may be used for other testing purposes as well. For example, FIG. 4 shows an embodiment of a shorting block 400 used to verify voltage level measurements of tester-handler setup 100. Shorting block 400 includes power pins 402 and 404 and ground pins 406 and 408. The remaining pins of shorting block 400 are signal pins. Although shorting block 400 is a passive device, as noted above, the positions of the power and ground pins must be known so that they are not coupled to signal pins when conducting timing verification tests. The remaining pins of shorting block 400 are signal pins. In the embodiment of FIG. 4, all of the remaining signal pins of shorting block 400 are connected together as shown. Again, power pins 402 and 404 and ground pins 406 and 408 are not coupled to any of the signal pins. In operation, device handler loads shorting block 400 into test socket 108. Device tester is programmed to then drive one of the signal pins, such as, for example, pin 410 with an input voltage. The voltage at each of the remaining pins is sampled by tester 102. If device tester-handler setup 100 is operating correctly and all the pins have a secure connection to tester 100, the voltage at each of the other signal pins will be the same value as the input voltage to pin 410. If there is some discrepancy, there is likely a problem with the integrity of tester-handler setup 100. The specific problem, such as perhaps a faulty pin on test socket 108 or a faulty connector in test bus 104, can be isolated through other means, such as using a shorting block described above in FIG. 3.

Figure 5:
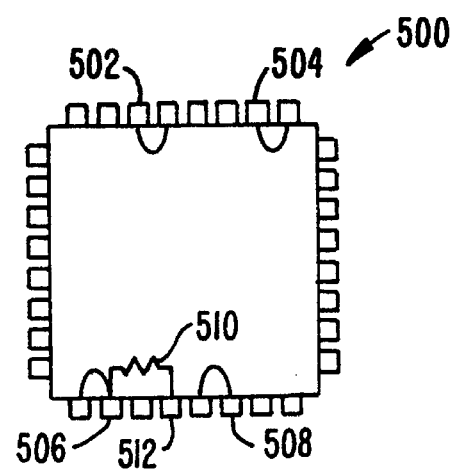
FIG. 5 shows an embodiment of a shorting block used to measure the temperature of a device handler and verify power supply levels.

FIG. 5 shows a shorting block 500 that may be used to measure the temperature of the chamber of device handler 112. While testing semiconductor devices in tester-handler setup 100, one of the operating conditions that needs to be monitored is the temperature of the chamber of device handler 112, where test socket 106 is located and the device testing is carried out. If the temperature rises to a very high level, the test results will be affected. Shorting block 500 includes power pins 502 and 504 and ground pins 506 and 508. The remaining pins of shorting block 500 are signal pins. A temperature sensing resistor 510 is included in shorting block 500 coupled between ground pin 506 and signal pin 512. Resistor 510 could be, merely by way of example, a platinum resistor that operates nominally at 1000 ohms, but whose resistance rises up to 1400 ohms as the operating temperature increases. Tester 102 can sample the temperature based upon the resistance observed at pin 512 with respect to the ground potential at pin 506. It should be understood that other well-known devices could be used in place of temperature sensing resistor 510, such as, for example, a temperature sensing diode or integrated circuit. If the temperature is found to be out of the accepted range, the tester-handler setup may be adapted to bring the temperature within accepted limits.

Figure 6:
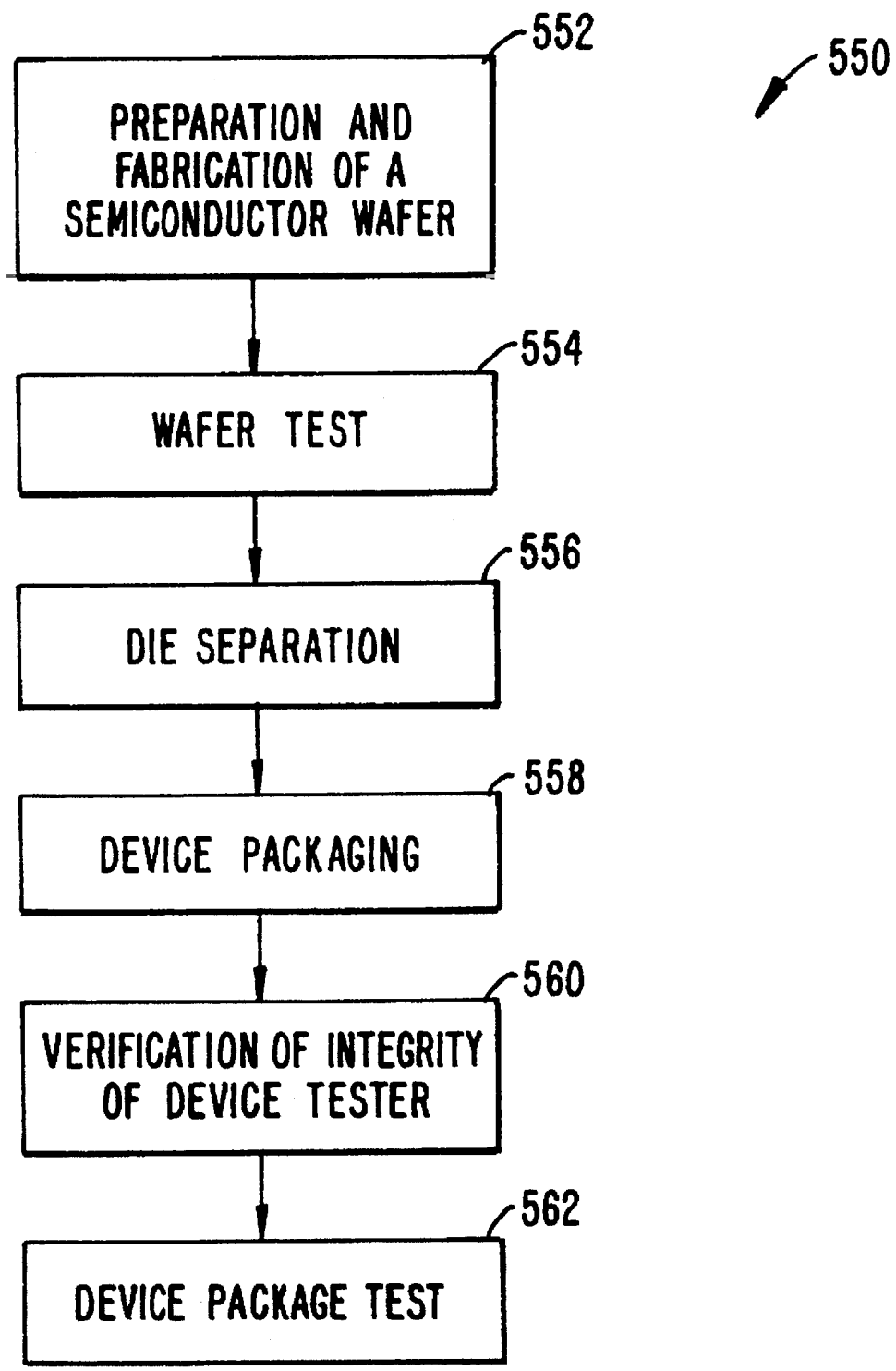
FIG. 6 is a flow diagram of the manufacturing process for an integrated circuit chip.

The method and apparatus described above for checking the integrity of a tester setup used in the manufacture of semiconductor devices is integrated into the process 550 of manufacturing an integrated circuit chip, as shown in FIG. 6. Generally, the first step 552 involves the preparation of a semiconductor wafer through crystal growth and the fabrication of individual electrical circuits on the wafer through ion implantation. After the individual electrical circuits are fabricated on a semiconductor wafer, the wafer is tested in step 554 to identify the circuits that are within specified limits and those that are not. Once the good circuits have been identified, the wafer is separated into individual chip die in step 556 so that only the good circuits are used further in the manufacture process. In step 558, each individual chip die is assembled into an appropriate device package suitable for incorporation into an end-use circuit. Prior to device package test, the integrity of the device tester setup is verified in step 560 using the method and apparatus described above. The device tester can be adapted in accordance with the results of the verification step. The device package itself is then tested in step 562 by a verified device tester to provide a final test of reliability and functionality. The devices that pass this final manufacturing step are semiconductor devices suitable for further use.

Figure 7:
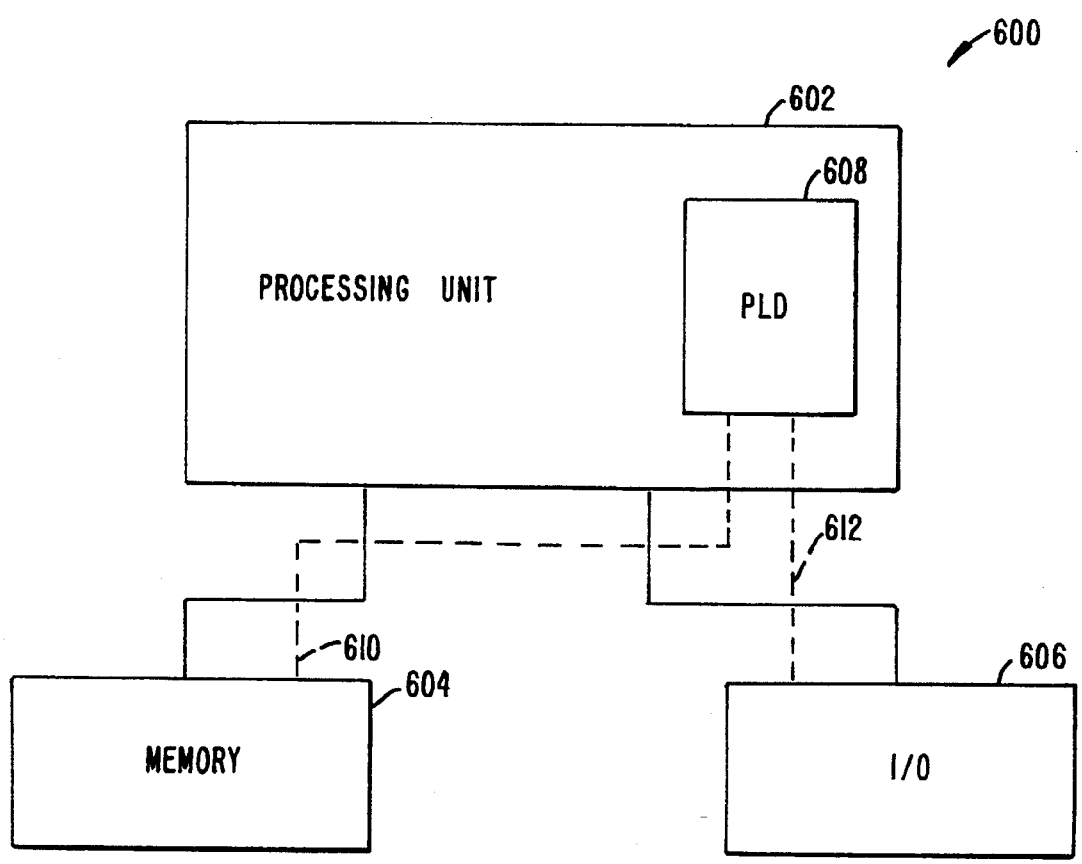
FIG. 7 shows a block diagram of a digital system in which a device tested by the present invention may be embodied.

The purpose of carrying out tests on a semiconductor device is, of course, to verify that the manufacturing process yields an operable semiconductor device suitable for end-use circuit and system level designs. As an example, FIG. 7 shows a block diagram of a digital system 600 within which a device tested by the present invention may be embodied. In the particular embodiment of FIG. 7, a processing unit 602 is coupled to a memory 604 and an I/O 606 and incorporates a programmable logic device (PLD) 608. PLD 608 is manufactured with the method and apparatus disclosed above. PLD 608 may be specially coupled to memory 604 through connection 610 and to I/O 606 through connection 612. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 608, or a combination of a general purpose computer and auxiliary special purpose hardware.

Processing unit 602 may direct data to an appropriate system component for processing or storage, execute a program stored in memory 604 or input using I/O 606, or other similar function. Processing unit 602 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 608 may control the logical operations of the system.

In some embodiments, processing unit 602 may even be a computer system. In one embodiment, source code may be stored in memory 604, compiled into machine language, and executed by processing unit 602. Processing unit 602 need not contain a CPU and in one embodiment, instructions may be executed by one or more PLDs 608. Instead of storing source code in memory 604, only the machine language representation of the source code, without the source code, may be stored in memory 604 for execution by processing unit 602. Memory 604 may be a random access memory (RAM), read only memory (ROM), fixed or flexible disk media, PC Card flash disk memory, tape, or any other storage retrieval means, or any combination of these storage retrieval means.

Processing unit 602 uses I/O 606 to provide an input and output path for user interaction. For example, a user may input logical functions to be programmed into programmable logic device 608. I/O 606 may be a keyboard, mouse, track ball, digitizing tablet, text or graphical display, touch screen, pen tablet, printer, or other input or output means, or any combination of these means. In one embodiment, I/O 606 includes a printer used for printing a hard copy of any processing unit 602 output. In particular, using I/O 606, a user may print a copy of a document prepared using a word processing program executed using processing unit 602. In other cases, a user may print out a copy of the source code or a listing of the logical functions contained within PLD 608.

PLD may serve many different purposes within the system in FIG. 7. PLD 608 may be a logical building block of processing unit 602, supporting its internal and external operations. PLD 608 is programmed to implement the logical functions necessary to carry on its particular role in system operation.

As some examples of the multitude of uses for PLD 608, processing unit 602 may use PLD 608, through connection 610, to decode memory or port addresses for accessing memory 604 or I/O 606. PLD 608 may be programmed to store data like a memory or specialized memory, where this comes from processing unit 602 or memory 604 (via connection 610). PLD 608 may be used as a microcontroller for a memory 604 device such as a fixed or flexible disk drive. PLD 608 may also be configured to be a microcontroller for an I/O 606 device such as a keyboard or scanner, passing data through connection 612.

In other embodiments, PLD 608 may be used as a controller or specialized processing unit such as a coprocessor for performing mathematical or graphical calculations. In still other embodiments, PLD 608 may be used for telecommunications applications. For example, processing unit 602 would direct data to PLD 608; PLD 608 processes this data; then PLD 608 returns the results to processing unit 602. Furthermore, processing unit 602 may pass or direct a program stored in memory 604 or input using I/O 606 to PLD 608 for execution. These are some of multitude of uses of PLD 608 within a digital system. Also, a system such as the one shown in FIG. 7 may embody a plurality of PLDs 608, each performing different system functions.

The system shown in FIG. 7 may also be used for programming PLD 608 with a particular logic pattern. A computer program for designing functions into a PLD may be stored in memory 604 and executed using processing unit 602. Then, a design characteristic which is to be programmed into PLD 608 is input via I/O 606 and processed by processing unit 602. In the end, processing unit 602 transfers and programs the design characteristic into PLD 608.

In FIG. 7, processing unit 602 is shown incorporating PLD 608. However, in other embodiments, PLD 608 may be external to processing unit 602, and a PLD interface may be coupled between processing unit 602 and PLD 608. The PLD interface would provide the proper adapters or sockets for interfacing PLD 608 to processing unit 602. Moreover, the PLD interface would provide the proper voltages and electrical characteristics for coupling PLD 608 to processing unit 602.

The above description is illustrative and not restrictive. Many variations of the invention will become apparent to those of skill in the art upon review of this disclosure. For example, the embodiment of shorting block 500 including a resistor 510 could also be used to measure the contact resistance on the power and ground pins. The scope of the invention should, therefore, be determined not with reference to the above description, but instead should be determined with reference to the appended claims along with their full scope of equivalents.

What is claimed is:

1. A configuration for verifying a semiconductor device tester-handler setup comprising:

a device tester including signal generation circuitry and measurement circuitry for performing electrical or functional tests on a device under test;

a loadboard coupled to said device tester for holding said device under test;

a device handler coupled to said loadboard for holding a plurality of semiconductor devices, said device handler loading said device under test onto said loadboard; and a direct electrical connection between said signal generation circuitry and said measurement circuitry of said device tester.

2. The configuration of claim 1 wherein said direct electrical connection further comprises an ohmic connection made with a wire inside a device package without logic cells therein.

3. The configuration of claim 1 wherein said direct electrical connection further comprises a shorting block.

4. The configuration of claim 3 wherein said shorting block further comprises a device package having a plurality of signal pins, wherein adjacent signal pins are directly coupled to each other.

5. The configuration of claim 3 wherein said shorting block further comprises a device package having a plurality of signal pins, wherein all signal pins are directly coupled to each other.

6. The configuration of claim 3 wherein said shorting block further comprises a device package having a plurality of signal pins, wherein a first selected signal pin is directly coupled to a second selected signal pin.

7. The configuration of claim 3 wherein said shorting block further comprises a device package having a plurality of signal pins, a temperature sensing device coupling a first selected signal pin to a second selected signal pin, said temperature sensing device measuring an operating temperature of the configuration.

8. A method of verifying integrity of a semiconductor device tester-handler setup comprising the steps of:

provides a device tester including signal generation circuitry and measurement circuitry for performing electrical or functional tests on a device under test;

providing a loadboard coupled to said device tester for holding said device under test in a socket;

providing a device handler coupled to said loadboard for holding a plurality of semiconductor devices, said device handler loading said device under test into said socket; and establishing a direct electrical connection between said signal generation circuitry and said measurement circuitry of said device tester.

9. The method of claim 8 further comprising the steps of:

measuring timing characteristics of said device tester through said direct electrical connection; and adapting said timing characteristics of said device tester in accordance with results of said measuring step.

10. The method of claim 8 wherein said step of establishing a direct electrical connection further comprises the step of establishing an ohmic connection made with a wire inside a device package without logic cells therein.

11. The method of claim 8 wherein said step of establishing a direct electrical connection further comprises the step of placing a shorting block in said socket.

12. The method of claim 9 wherein said step of placing a shorting block in said socket further comprises the step of placing a device package in said socket having a plurality of signal pins wherein adjacent signal pins are directly coupled to each other.

13. The method of claim 9 wherein said step of placing a shorting block in said socket further comprises the step of placing a device package in said socket having a plurality of signal pins wherein all signal pins are directly coupled to each other.

14. The method of claim 9 wherein said step of placing a shorting block in said socket further comprises the step of placing a device package in said socket having a plurality of signal pins wherein a first selected signal pin is directly coupled to a second selected signal pin.

15. The method of claim 9 wherein said step of placing a shorting block in said socket further comprises the step of placing a device package in said socket having a plurality of signal pins wherein a temperature sensing device couples a first selected signal pin to a second selected signal pin, said temperature sensing device measuring an operating temperature of the configuration.

16. A method of manufacturing an integrated circuit chip comprising the steps of:

preparing and fabricating a plurality of electrical circuits on a semiconductor wafer;

testing the semiconductor wafer to identify functioning circuits in said plurality of electrical circuits;

separating said semiconductor wafer into individual chip die to isolate said functioning circuits;

assembling each of individual chip die containing said functioning circuits into a separate device package;

verifying integrity of a configuration for a device tester, said verifying step comprising the steps of:

providing said device tester including signal generation circuitry and measurement circuitry for performing electrical or functional tests on a device under test;

providing a loadboard coupled to said device tester for holding said device under test in a socket;

providing a device handler coupled to said loadboard for holding a plurality of semiconductor devices, said device handler loading said device under test into said socket; and establishing a direct electrical connection between said signal generation circuitry and said measurement circuitry of said device tester; and testing said separate device package with said device tester.

17. The method of claim 16 wherein said step of verifying integrity further comprising the steps of:

measuring timing characteristics of said device tester through said direct electrical connection; and adapting said timing characteristics of said device tester in accordance with results of said measuring step.

18. The method of claim 16 wherein said step of establishing a direct electrical connection further comprises the step of establishing an ohmic connection made with a wire inside a device package without logic cells therein.

19. The method of claim 16 wherein said step of establishing a direct electrical connection further comprises the step of placing a shorting block in said socket.

20. The method of claim 19 wherein said step of placing a shorting block in said socket further comprises the step of placing a device package in said socket having a plurality of signal pins wherein adjacent signal pins are directly coupled to each other.

21. The method of claim 19 wherein said step of placing a shorting block in said socket further comprises the step of placing a device package in said socket having a plurality of signal pins wherein all signal pins are directly coupled to each other.

22. The method of claim 19 wherein said step of placing a shorting block in said socket further comprises the step of placing a device package in said socket having a plurality of signal pins wherein a first selected signal pin is directly coupled to a second selected signal pin.

23. The method of claim 19 wherein said step of placing a shorting block in said socket further comprises the step of placing a device package in said socket having a plurality of signal pins wherein a temperature sensing device couples a first selected signal pin to a second selected signal pin, said temperature sensing device measuring an operating temperature of the configuration.

24. A system comprising a integrated circuit manufactured by the method recited in claim 16.

* * * * *